United States Patent
Liu et al.

(10) Patent No.: US 9,552,858 B2
(45) Date of Patent: Jan. 24, 2017

(54) STT-MRAM CELL STRUCTURE INCORPORATING PIEZOELECTRIC STRESS MATERIAL

(71) Applicant: Micron Technology, Inc., Boise, ID (US)

(72) Inventors: Jun Liu, Boise, ID (US); Steve Kramer, Boise, ID (US); Gurtej Sandhu, Boise, ID (US)

(73) Assignee: Micron Technology. Inc., Boise, ID (US)

( * ) Notice: Subject to any disclaimer, the term of this patent is extended or adjusted under 35 U.S.C. 154(b) by 0 days.

(21) Appl. No.: 14/947,978

(22) Filed: Nov. 20, 2015

(65) Prior Publication Data

US 2016/0078912 A1    Mar. 17, 2016

Related U.S. Application Data

(60) Division of application No. 13/673,130, filed on Nov. 9, 2012, now Pat. No. 9,218,863, which is a continuation of application No. 12/242,247, filed on Sep. 30, 2008, now Pat. No. 8,310,861.

(51) Int. Cl.
| | | |
|---|---|---|
| *G11C 11/00* | (2006.01) | |
| *G11C 11/16* | (2006.01) | |
| *H01L 27/22* | (2006.01) | |
| *H01L 43/08* | (2006.01) | |

(52) U.S. Cl.
CPC ............. *G11C 11/161* (2013.01); *G11C 11/16* (2013.01); *G11C 11/1675* (2013.01); *H01L 27/228* (2013.01); *H01L 43/08* (2013.01)

(58) Field of Classification Search
CPC ........... G11C 11/16; G11C 11/15; H01L 43/03
USPC ......................................... 365/158, 171, 173
See application file for complete search history.

(56) References Cited

U.S. PATENT DOCUMENTS

| | | |
|---|---|---|
| 6,339,543 B1 | 1/2002 | Shimada et al. |
| 6,379,978 B2 | 4/2002 | Goebel et al. |
| 6,424,563 B2 | 7/2002 | Honigschmid |
| 6,490,217 B1 | 12/2002 | DeBrosse et al. |
| 6,829,157 B2 | 12/2004 | Kim et al. |
| 6,847,547 B2 | 1/2005 | Albert et al. |
| 6,896,975 B2 | 5/2005 | Lin et al. |
| 6,982,916 B2 | 1/2006 | Tsang |
| 6,992,359 B2 | 1/2006 | Nguyen et al. |

(Continued)

FOREIGN PATENT DOCUMENTS

| | | |
|---|---|---|
| CN | 1883007 A | 12/2006 |
| CN | 1906701 A | 1/2007 |

(Continued)

OTHER PUBLICATIONS

KR Application No. 10-2011-7009901 Notice of Preliminary Rejection mailed Aug. 31, 2016; 12 pages.

*Primary Examiner* — Son Dinh
(74) *Attorney, Agent, or Firm* — Fletcher Yoder, P.C.

(57) ABSTRACT

A magnetic memory cell including a piezoelectric material, and methods of operating the memory cell are provided. The memory cell includes a stack, and the piezoelectric material may be formed as a layer in the stack or adjacent the layers of the cell stack. The piezoelectric material may be used to induce a transient stress during programming of the memory cell to reduce the critical switching current of the memory cell.

19 Claims, 6 Drawing Sheets

(56) References Cited

U.S. PATENT DOCUMENTS

| | | |
|---|---|---|
| 7,009,877 B1 | 3/2006 | Huai et al. |
| 7,042,762 B2 | 5/2006 | Nakamura et al. |
| 7,045,368 B2 | 5/2006 | Hong et al. |
| 7,068,536 B2 | 6/2006 | Matsutera et al. |
| 7,088,609 B2 | 8/2006 | Valet |
| 7,126,202 B2 | 10/2006 | Huai et al. |
| 7,211,874 B2 | 5/2007 | Guo et al. |
| 7,224,601 B2 | 5/2007 | Panchula |
| 7,230,844 B2 | 6/2007 | Deak |
| 7,257,021 B2 | 8/2007 | Lienau et al. |
| 7,282,755 B2 | 10/2007 | Pakala et al. |
| 7,307,876 B2 | 12/2007 | Kent et al. |
| 7,310,265 B2 | 12/2007 | Zheng et al. |
| 7,339,819 B2 | 3/2008 | Johnson |
| 7,369,427 B2 | 5/2008 | Diao et al. |
| 7,372,722 B2 | 5/2008 | Jeong et al. |
| 7,394,685 B2 * | 7/2008 | Ooishi .................... G11C 11/16 365/171 |
| 7,430,135 B2 | 9/2008 | Huai et al. |
| 7,433,161 B2 | 10/2008 | Ikarashi et al. |
| 7,876,603 B2 | 1/2011 | Liu et al. |
| 8,102,700 B2 | 1/2012 | Liu et al. |
| 2005/0106810 A1 | 5/2005 | Pakala et al. |
| 2006/0118842 A1 | 6/2006 | Iwata |
| 2006/0133137 A1 * | 6/2006 | Shin ........................ G11C 11/15 365/158 |
| 2006/0262594 A1 | 11/2006 | Fukumoto |
| 2008/0049488 A1 | 2/2008 | Rizzo |
| 2008/0061388 A1 | 3/2008 | Diao et al. |
| 2008/0180991 A1 | 7/2008 | Wang |
| 2008/0197431 A1 | 8/2008 | Morise et al. |
| 2008/0225585 A1 | 9/2008 | Ranjan et al. |
| 2008/0265234 A1 | 10/2008 | Breitwisch et al. |

FOREIGN PATENT DOCUMENTS

| | | |
|---|---|---|
| CN | 1934652 A | 3/2007 |
| WO | WO2008010957 A | 1/2008 |

* cited by examiner

STT-MRAM CELL STRUCTURE INCORPORATING PIEZOELECTRIC STRESS MATERIAL

CROSS-REFERENCE TO RELATED APPLICATION

This application is a divisional of U.S. patent application Ser. No. 13/673,130, which was filed on Nov. 9, 2012, which is a continuation of U.S. patent application Ser. No. 12/242,247, which was filed on Sep. 30, 2008, now U.S. Pat. No. 8,310,861, which issued on Nov. 13, 2012.

BACKGROUND

Field of Invention

The invention relates generally to magnetic random access memory, and more particularly, to Spin Torque Transfer Magnetic Random Access Memory (STT-MRAM).

Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies which store data as electric charge, MRAM data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and susceptible to write disturbances. The programming current employed to switch between high and low resistance states across the MRAM magnetic layers is typically high. Thus, when multiple cells are arranged in an MRAM array, the programming current directed to one memory cell may induce a field change in the free layer of an adjacent cell. This potential for writes disturbances, also known as the "half-select problem," can be addressed using a spin torque transfer technique.

A conventional spin torque transfer MRAM (STT-MRAM) cell includes a magnetic tunnel junction (MTJ), which is a magnetoresistive data storing element including two magnetic layers (one pinned and one free) and an insulating layer in between, a bit line, a word line, a source line, and an access transistor. A programming current typically flows through the access transistor and the MTJ. The pinned layer polarizes the electron spin of the programming current, and torque is created as the spin-polarized current passes through the MTJ. The spin-polarized electron current interacts with the free layer by exerting a torque on the free layer. When the torque of the spin-polarized electron current passing through the MTJ is greater than the critical switching current density ($J_c$), the torque exerted by the spin-polarized electron current is sufficient to switch the magnetization of the free layer. Thus, the magnetization of the free layer can be aligned to be either parallel or antiparallel to the pinned layer, and the resistance state across the MTJ is changed.

The STT-MRAM has advantageous characteristics over the MRAM, because the spin-polarized electron current eliminates the need for an external magnetic field to switch the free layer in the magnetoresistive elements. Further, scalability is improved as the programming current decreases with decreasing cell sizes, and the writing disturbance and half-select problem is addressed. Additionally, STT-MRAM technology allows for a higher tunnel magnetic resistance ratio, meaning there is a larger ratio between high and low resistance states, improving read operations in the magnetic domain.

However, high programming current densities through the STT-MRAM cell are still problematic, as high current densities through the magnetic layers increase the energy consumption in the cell and the thermal profile in the layers, affecting the cell's integrity and reliability. High current densities through the magnetic layers may also lead to larger silicon real estate consumption for each cell.

BRIEF DESCRIPTION OF DRAWINGS

Certain embodiments are described in the following detailed description and in reference to the drawings in which.

DETAILED DESCRIPTION

As previously discussed, a spin torque transfer magnetic random access memory (STT-MRAM) cell is programmed by switching the magnetization of the free layer in the cell's magnetic tunnel junction (MTJ). Switching occurs when the current density passing through the memory cell is larger than the critical switching current density. Thus, to program the cell, the programming current density need only be slightly higher than the critical switching current density. Since passing a larger switching current increases the energy consumption and the thermal profile in the MTJ, which affects the integrity and reliability of the cell, it is desirable to decrease the critical switching current without affecting the cell's thermal stability. Decreasing the critical switching current would allow a smaller current to switch the free layer when programming the cell. The following discussion describes the systems and devices, and the operation of such systems and devices in accordance with the embodiments of the present technique.

Figure 1:
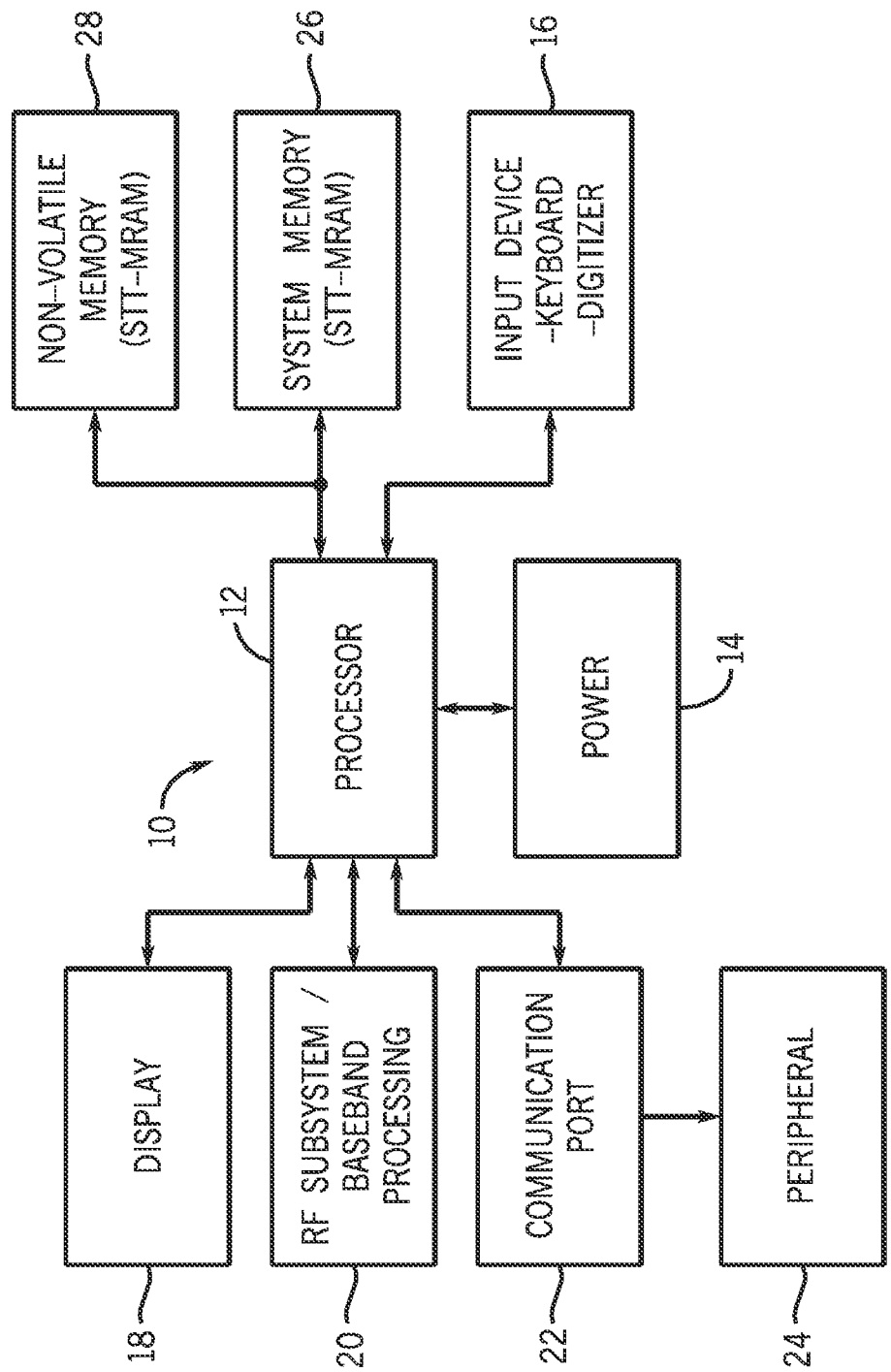
FIG. 1 depicts a block diagram of a processor-based system in accordance with an embodiment of the present technique.

FIG. 1 depicts a processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include resistive memory devices manufactured in accordance with embodiments of the present technique.

The system 10 typically includes a power supply 14. For instance, if the system 10 is a portable system, the power supply 14 may advantageously include a fuel cell, a power scavenging device, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The software programs may include an operating system, database software, drafting software, word processing software, and/or video, photo, or sound editing software, for example. The memory is operably coupled to the processor 12 to store and facilitate execution of various programs. For instance, the processor 12 may be coupled to the system memory 26, which may include spin torque transfer magnetic random access memory (STT-MRAM), magnetic random access memory (MRAM), dynamic random access memory (DRAM), and/or static random access memory (SRAM). The system memory 26 may include volatile memory, non-volatile memory, or a combination thereof. The system memory 26 is typically large so that it can store dynamically loaded applications and data. In some embodiments, the system memory 26 may include STT-MRAM devices, such as those discussed further below.

The processor 12 may also be coupled to non-volatile memory 28, which is not to suggest that system memory 26 is necessarily volatile. The non-volatile memory 28 may include STT-MRAM, MRAM, read-only memory (ROM), such as an EPROM, resistive read-only memory (RROM), and/or flash memory to be used in conjunction with the system memory 26. The size of the ROM is typically selected to be just large enough to store any necessary operating system, application programs, and fixed data. Additionally, the non-volatile memory 28 may include a high capacity memory such as a tape or disk drive memory, such as a hybrid-drive including resistive memory or other types of non-volatile solid-state memory, for instance. As is explained in greater detail below, the non-volatile memory 28 may include STT-MRAM devices manufactured in accordance with embodiments of the present technique.

Figure 2:
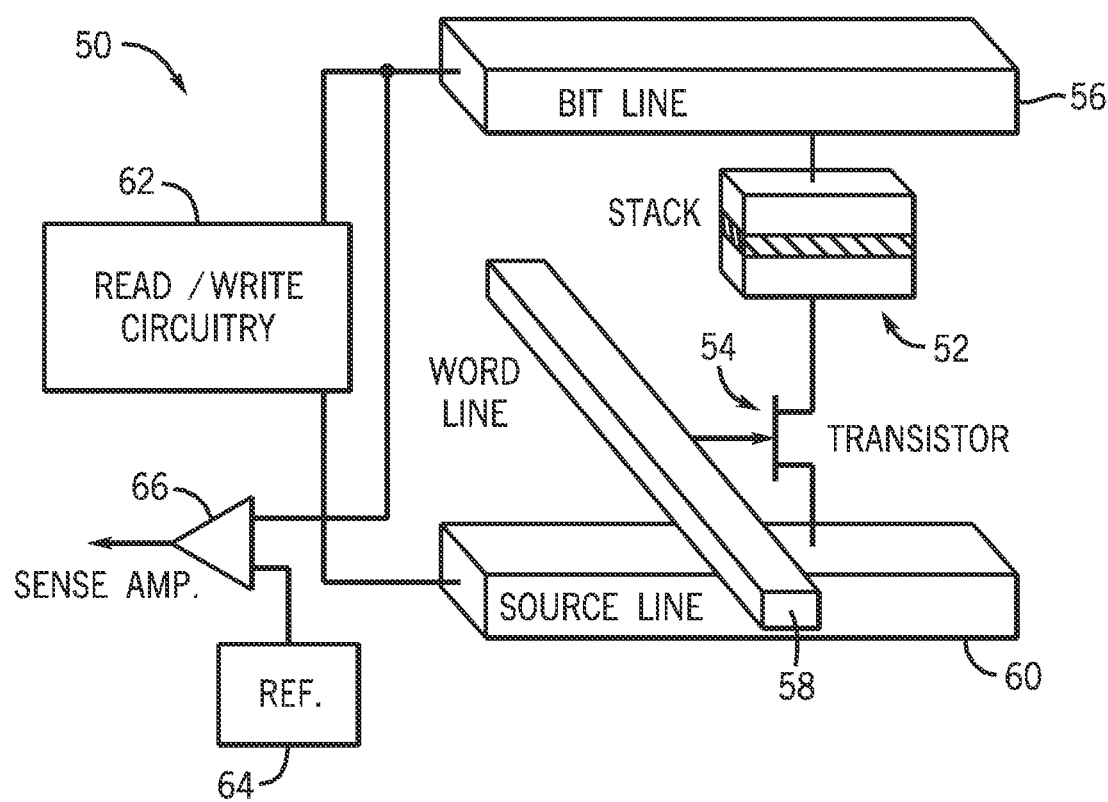
FIG. 2 depicts a schematic diagram of a portion of a memory array having memory cells fabricated in accordance with embodiments of the present invention.

FIG. 2 illustrates an STT-MRAM cell 50, which may be fabricated to form an array of memory cells in a grid pattern including a number of rows and columns, or in various other arrangements depending on the system requirements and fabrication technology. An arrangement of memory cells may be implemented in the system memory 26 or the volatile memory 28 depicted in FIG. 1.

STT-MRAM cell 50 includes a stack 52, an access transistor 54, a bit line 56, a word line 58, a source line 60, read/write circuitry 62, a bit line reference 64, and a sense amplifier 66. The stack 52 may include a magnetic tunnel junction (MTJ), including a free layer, and a pinned layer. As will be described further below with specific reference to FIGS. 3A, 3B, 4A, 4B and 5-7, the stack 52 may further include a piezoelectric material, and nonmagnetic layers in accordance with embodiments of the present technique. In various embodiments described below, the piezoelectric material in the stack 52 may be a piezoelectric layer disposed on or below the MTJ of the stack 52 (FIGS. 3A, 3B, 4A and 4B), or the piezoelectric material may be formed adjacent to the MTJ of the stack 52, as either a spacer (FIG. 5) or an isolation material between adjacent cells (FIG. 6).

As used herein, the STT-MRAM cell 50 generally includes a "magnetic cell structure." The magnetic cell structure may be an MTJ, as discussed above, if a nonmagnetic layer between the free layer and the pinned layer of the stack 52 is insulative. Alternatively, the magnetic cell structure may be a spin valve, if the nonmagnetic layer between the free layer and the pinned layer is conductive. As used in the present specification, the term "stack" may refer to a memory cell stack, magnetic cell stack, STT-MRAM cell stack, or any component of a memory cell which may include layers and materials in accordance with an embodiment of the present technique. Further, the piezoelectric material is referred to as a "layer" when the material is formed above or below the MTJ, parallel to the layers of the MTJ. The piezoelectric material is said to be "adjacent" to the MTJ when the piezoelectric material is formed in the same plane as a portion of the MTJ. The piezoelectric material may be adjacent to the MTJ, when the piezoelectric material forms a spacer on either side of the MTJ when viewed cross-sectionally, or when the piezoelectric material is employed as an isolation material between adjacent cells. The distinction between the piezoelectric material being formed as a layer or formed adjacent to the MTJ will be appreciated by those skilled in the art and the claims of the instant application should be read with this distinction in mind.

As also used herein, it should be understood that when a layer is said to be "formed on" or "disposed on" another layer, there may be intervening layers formed or disposed between those layers. Similarly, if materials are said to be "adjacent" to other materials, there may be intervening materials therebetween. Conversely, if a layer or material is said to be "formed directly on," "disposed directly on," or formed/disposed "directly adjacent to" or "in direct contact with," the materials or layers include no intervening materials or layers therebetween.

When the STT-MRAM cell 50 is selected to be programmed, a programming current is applied to the cell, and the current is spin-polarized by the pinned layer and exerts a torque on the free layer, which switches the magnetization of the free layer to "write to" or "program" the cell. In a read operation of the STT-MRAM cell 50, a current is used to detect the resistance state of the memory cell stack 52. As will be further discussed, incorporating a piezoelectric layer in the stack 52 may decrease the critical switching current required to switch the magnetization of the free layer, thus allowing a smaller programming current to write the STT-MRAM cell 50.

As previously discussed, a programming current is applied for the write operation of STT-MRAM cell 50. To initiate the programming current, the read/write circuitry 62 may generate a write current to the bit line 56 and the source line 60. The polarity of the voltage between the bit line 56 and the source line 60 determines the switch in magnetization of the free layer in the stack 52. Once the free layer is magnetized according to the spin polarity of the programming current, the programmed state is written to the STT-MRAM cell 50.

To read the STT-MRAM cell 50, the read/write circuitry 62 generates a read current to the bit line 56 and the source line 60 through the stack 52 and the transistor 54. The programmed state of the STT-MRAM cell 50 depends on the resistance across the stack 52 which may be determined by the voltage difference between the bit line 56 and the source line 60. In some embodiments, the voltage difference may be compared to a reference 64 and amplified by a sense amplifier 66.

Figure 3A:
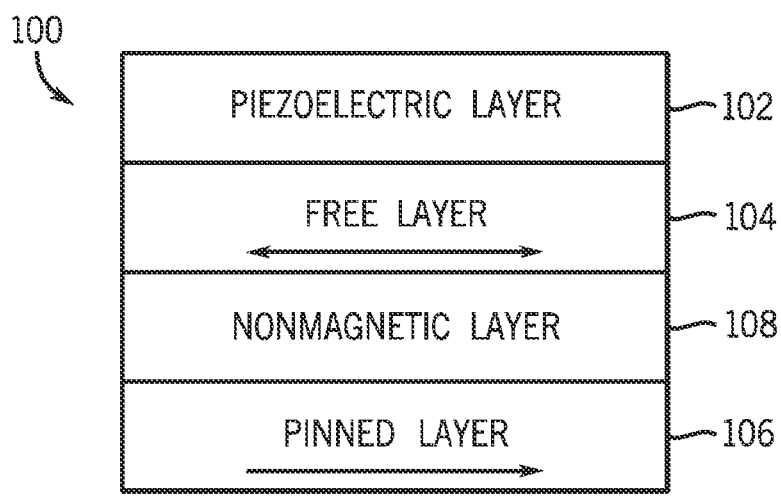
FIGS. 3A and 3B, and 4A and 4B depict STT-MRAM cell stacks with built in piezoelectric layers in accordance with embodiments of the present invention.

One embodiment of the present invention, incorporating a piezoelectric material into an STT-MRAM cell, is illustrated in FIG. 3A, where a piezoelectric layer 102 is included in a memory cell stack 100 of an STT-MRAM cell to decrease the critical switching current. Each of the stacks illustrated and described in the figures below, may be incorporated into the STT-MRAM cell 50, described in FIG. 2. In the illustrated embodiment of FIG. 3A, the piezoelectric layer 102 is disposed on top of the free layer 104. The free layer 104 and pinned layer 106 are separated by a nonmagnetic layer 108, thereby forming an MTJ or a spin valve dependent on whether the nonmagnetic layer 108 is conductive or not.

The memory cell may be programmed by switching the magnetization of the free layer 104 in the memory cell stack 100, and the cell may be read by determining the resistance across the free layer 104 and the pinned layer 106. The layers 104 and 106 may comprise ferromagnetic materials, such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as Fe3O4, CrO2, NiMnSb and PtMnSb, and BiFeO, for instance. The pinned layer 106 is so named because it has a fixed magnetization with a fixed or pinned preferred orientation, and this is represented by the unidirectional arrow illustrated in the pinned layer 106. An additional layer of antiferromagnetic material may be deposited below the pinned layer 106 to achieve the pinning through exchange coupling. The bidirectional arrow illustrated in the free layer 104 represents that the free layer 104 may be magnetized either in a direction parallel to the pinned layer 106, which gives a low resistance, or in a direction antiparallel to the pinned layer 106, which gives a high resistance. The stack 100 may also include a nonmagnetic layer 108 between the free layer 104 and the pinned layer 106 to serve as an insulator between the two layers 104 and 106. The nonmagnetic layer 108 may comprise $Al_xO_y$, MgO, AlN, SiN, $CaO_x$, $NiO_x$, $Hf_xO_y$, $Ta_xO_y$, $Zr_xO_y$, $NiMnO_x$, $Mg_xF_y$, SiC, $SiO_2$, $SiO_xN_y$, or any combination of the above materials.

Switching of the free layer 104 occurs when a current density passed through the memory cell is greater than a critical switching current density. In one embodiment, a piezoelectric layer 102 is incorporated immediately on top of the free layer 104 in the stack 100. The piezoelectric layer 102 influences magnetic reversal of the free layer by generating a transient stress which influences the effective magnetic field in the free layer 104, thus reducing the critical switching current density and allowing a smaller current to switch the free layer and program the cell. More specifically, if a memory cell is selected to be programmed, voltage may be applied across the memory cell stack 100. When voltage is applied across the stack 100, the piezoelectric layer 102 may generate a transient stress in the free layer 104 to facilitate the switching. The transient stress influences the magnetic anisotropy field $H_k$ through the magnetoelastic effect to lower the energy barrier for magnetization reversal.

The equation below represents the critical switching current density $J_c$, where a represents the damping constant, $M_s$ represents the magnetization, $t_F$ represents the thickness of the free layer, and $H_k$ represents the magnetic anisotropy field of the free layer:

$$J_{c0} = \frac{2eaM_s t_F (H + H_k + 2\pi M_s)}{\hbar \eta}$$

The critical switching current density is dependent on the thickness of the free layer $t_F$ and the magnetic anisotropy field $H_k$. When the piezoelectric layer 102 is incorporated into the stack 100, a transient induced stress is generated in the free layer 104 which influences the magnetic anisotropy field of the free layer 104 and reduces the critical switching current by introducing an equivalent magnetic field component $H_\sigma$, where σ is the transient induced stress. The equation below represents the relationship between the transient induced stress σ and the magnetic field component $H_\sigma$:

$$H_\sigma = 3/2\sigma \left(\frac{d\lambda}{dM}\right)_T$$

The transient induced stress generated by the piezoelectric layer 102 may decrease the magnetic anisotropy field $H_k$ such that the critical switching current density $J_c$, and thus the energy barrier, is decreased. Additionally, the transient stress can also change the alignment of the spin-up and spin-down subbands in certain ferromagnetic materials in the free layer 104 to adjust its magnetization $M_s$ and further reduce the critical switching current.

In addition to decreasing the energy barrier and requiring a smaller current density to switch the free layer 104 of a memory cell, the transient stress effect may preserve thermal stability required for data retention. The stress generated by the piezoelectric layer 102 is transient in that voltage will only be applied, and stress will only be induced, if the memory cell is being programmed. When the memory cell is not being programmed, stress will not be induced. Because the applied stress is transient, the cell may be more stable after switching.

In some embodiments, the piezoelectric layer 102 may be composed of a conductive piezoelectric material, such as (TaSe4)2I, multi-layered AlxGa1-xAs/GaAs, BaTiO3/VGCF/CPE composites, or other piezoelectric/conductive material composites. In other embodiments, the piezoelectric layer 102 may be an insulative material, such as berlinite ($AlPO_4$), quartz, gallium orthophosphate ($GaPO_4$), or langasite ($La_3Ga_5SiO_{14}$), ceramics with perovskite or tungsten-bronze structures, such as barium titanate ($BaTiO_3$), SrTiO3, bismuth ferrite ($BiFeO_3$), lead zirconate titanate ($Pb[Zr_xTi_{1-x}]O_3$ 0<x<1), $Pb_2KNb_5O_{15}$, lead titanate (PbTiO3), lithium tantalate ($LiTaO_3$), sodium tungstate ($Na_xWO_3$), potassium niobate ($KNbO_3$), lithium niobate ($LiNbO_3$), or $Ba_2NaNb_5O_5$, and other materials such as ZnO, AlN, polyvinylidene fluoride (PVDF), lanthanum gallium silicate, potassium sodium tartrate, or sodium potassium niobate (KNN). The thickness of the piezoelectric layer 102 may be thin (e.g., in the range of about 5 A to about 20 A) to allow current tunneling through the layer. Further, the nonmagnetic layer 108 can be either conductive or nonconductive. The conductive nonmagnetic layer 108 may comprise Cu, Au, Ta, Ag, CuPt, CuMn, or other nonmagnetic transition metals, or any combination of the above nonmagnetic conductive materials. The nonconductive nonmagnetic layer may comprise $Al_xO_y$, MgO, AlN, SiN, $CaO_x$, $NiO_x$, $Hf_xO_y$, $Ta_xO_y$, $Zr_xO_y$, $NiMnO_x$, $Mg_xF_y$, SiC, $SiO_2$, $SiO_xN_y$, or any combination of the above nonmagnetic nonconductive materials.

Figure 3B:
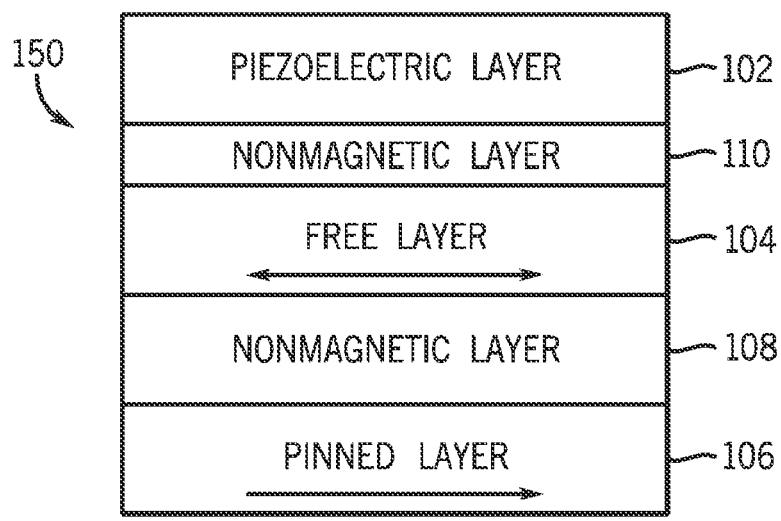

FIG. 3B illustrates another embodiment in which a stack 150 in a STT-MRAM cell includes a piezoelectric layer 102, a free layer 104, a pinned layer 106, a nonmagnetic layer 108, and an additional nonmagnetic layer 110 between the piezoelectric layer 102 and the free layer 104 which may serve as a buffer layer and allow for the transfer of stress from the piezoelectric layer 102 to the free layer 104 without direct physical contact. The nonmagnetic layer 110 may eliminate interfacial effects and may also address difficulties in the memory cell fabrication if the material used for the piezoelectric material 102 is incompatible with the material used in the free layer 104 which would inhibit the effects of the piezoelectric layer 102. The nonmagnetic layer 110 may be a conductive layer or a nonconductive layer. A conductive nonmagnetic layer 110 may comprise Cu, Au, Ta, Ag, CuPt, CuMn, or other nonmagnetic transition metals, or any combination of the above nonmagnetic conductive materials. A nonconductive nonmagnetic layer 110 may comprise $Al_xO_y$, MgO, AlN, SiN, $CaO_x$, $NiO_x$, $Hf_xO_y$, $Ta_xO_y$, $Zr_xO_y$, $NiMnO_x$, $Mg_xF_y$, SiC, $SiO_2$, $SiO_xN_y$, or any combination of the above nonmagnetic nonconductive materials.

Figures 4A, 4B:
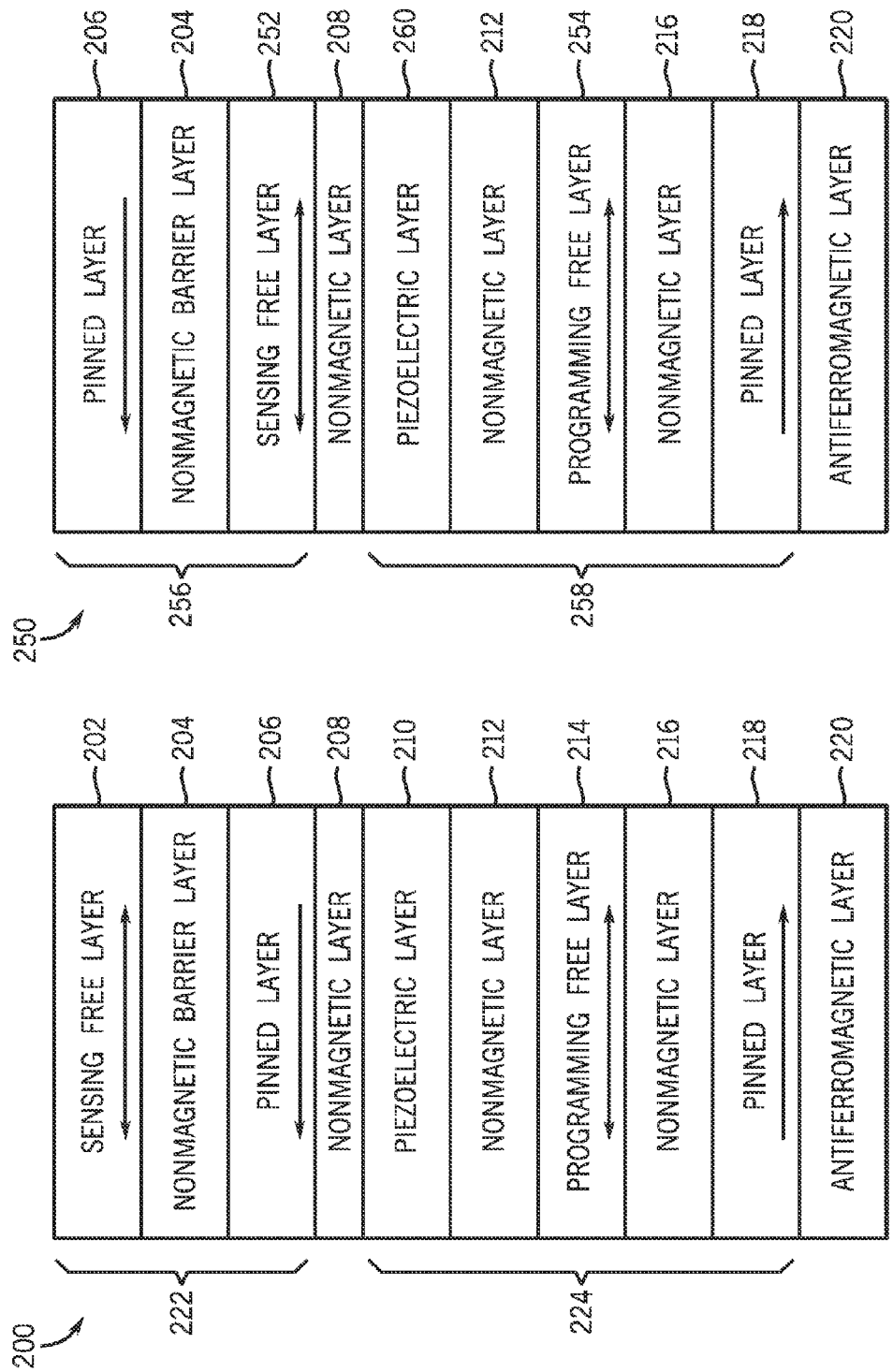

Another embodiment of a stack incorporating a piezoelectric layer is illustrated in FIG. 4A. In this embodiment, the STT-MRAM cell comprises a memory cell stack 200 with a piezoelectric layer 210 and an additional MTJ component 222 having a magnetostatically-coupled free sensing layer 202. The memory cell may be programmed by switching the magnetization of the programming free layer 214 in the stack 200 of the memory cell. The pinned layer 218 has a fixed magnetization, and this is represented by the unidirectional arrow illustrated in the pinned layer 218. The bidirectional arrow illustrated in the programming free layer 214 represents that the programming free layer 214 may be magnetized either in a direction parallel to the pinned layer 218, which gives a low resistance, or in a direction antiparallel to the pinned layer 218, which gives a high resistance. The stack 200 may also comprise a nonmagnetic layer 216 between the programming free layer 214 and the pinned layer 218 to serve as an insulator between the two layers 214 and 218. A piezoelectric layer 210 is incorporated into stack 200, and in some embodiments, a nonmagnetic layer 212 may separate the piezoelectric layer 210 from the programming free layer 214, as previously described. The nonmagnetic layer 212 may eliminate interfacial effects and may also address difficulties in the memory cell fabrication if the material used for the piezoelectric material 210 is incompatible with the material used in the programming free layer 214 which would inhibit the effects of the piezoelectric layer 210.

As previously explained, the piezoelectric layer 210 may generate a transient stress to decrease the energy barrier, thus allowing a smaller current density to switch the programming free layer 214 of a memory cell and preserving thermal stability required for data retention. An antiferromagnetic layer 220 may be added to the stack 200 to help pin the pinned layer 218 and maintain magnetization of the pinned layer 218 and preserve cell stability.

Additionally, in the present embodiment, the stack 200 may comprise an additional MTJ component 222 including a sensing free layer 202 and a pinned layer 206. This additional component is coupled magnetostatically to the original stack component 224 (previously described with reference to FIGS. 3A and 3B), such that changing the magnetization of the programming free layer 214 will change the magnetization of the sensing free layer 202. The sensing free layer 202 of the additional MTJ component 222 is magnetostatically coupled to the programming free layer 214 to be antiparallel in magnetization, thus improving the sensing margin and the resistance ratio between the two programmed states. A nonmagnetic barrier layer 204 between the sensing free layer 202 and the pinned layer 206 may also improve the resistance ratio. Further, the additional MTJ component 222 may be separated from the original stack component 224 by a nonmagnetic layer 208.

FIG. 4B illustrates another embodiment where a stack 250 of a memory cell comprises a piezoelectric layer 260 and an additional MTJ component 256 with a sensing free layer 252 coupled magnetostatically to the programming free layer 254 in an original stack component 258. In this embodiment, the sensing free layer 252 is placed closer to the programming free layer 254, and both free layers 252 and 254 are affected by the transient stress effect created by the piezoelectric layer 260.

Figure 5:
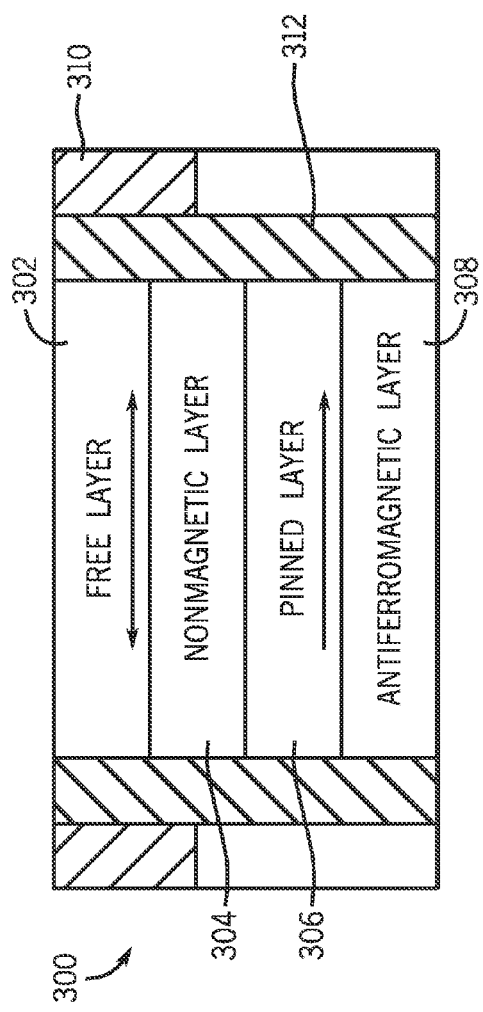
FIG. 5 depicts a STT-MRAM cell stack comprising a piezoelectric spacer in accordance with embodiments of the present invention.
Figure 6:
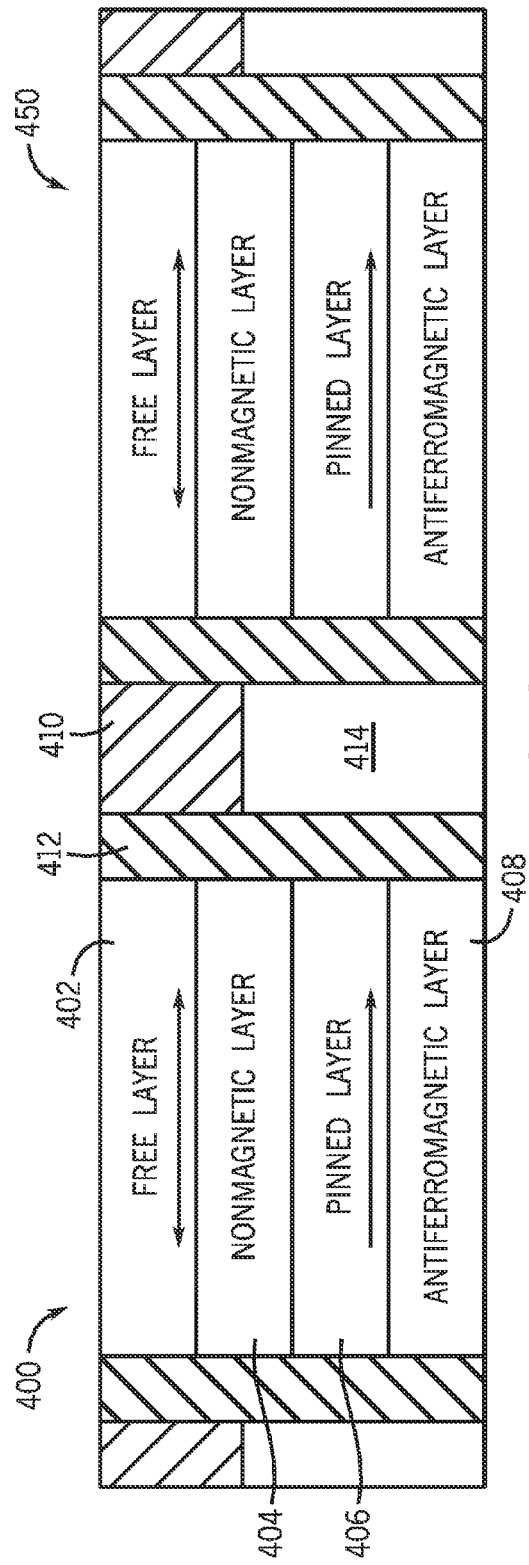
FIG. 6 depicts two STT-MRAM cell stacks comprising an insulative piezoelectric material in accordance with embodiments of the present invention.

Turning now to FIG. 5, another embodiment of the present invention is illustrated where a STT-MRAM cell includes a stack having a piezoelectric material disposed adjacent to layers in a memory cell stack. Specifically, a piezoelectric spacer 310 may be located adjacent to a free layer 302. The memory cell may be programmed by switching the magnetization of the free layer 302 in the stack 300 of the memory cell. The pinned layer 306 has a fixed magnetization, and this is represented by the unidirectional arrow illustrated in the pinned layer 306. The bidirectional arrow illustrated in the free layer 302 represents that the free layer 302 may be magnetized either in a direction parallel or antiparallel to the pinned layer 306. The stack 300 may also comprise a nonmagnetic layer 304 between the free layer 302 and the pinned layer 306. Additionally, an antiferromagnetic layer 308 may be added to the stack 300 to help pin the pinned layer 306 and maintain magnetization of the pinned layer 306 and enforce stability in the cell.

When a cell is selected to be programmed, voltage may be applied to the cell. The voltage drops across the selected cell, and an adjacent unselected cell to create a parasitic electric field from the voltage applied to the selected cell. This enables the activation of the piezoelectric spacer 310 on the selected cell and induces a transient stress on the free layer 302 to facilitate its switching. As previously discussed, the transient stress reduces the critical switching current density, lowering the energy barrier for switching the free layer 302 and programming the memory cell. When no voltage is applied, no stress is applied by the piezoelectric spacer 310, and the memory cell retains its thermal stability. Further, since current does not have to go through a piezoelectric layer to induce the thermal stress effect, as in the embodiments described above, the piezoelectric spacer 310 may contain insulative material in other embodiments, as will further be described in FIG. 6. The piezoelectric spacer 310 may be isolated from the stack 300 by an insulative spacer 312 such that the piezoelectric spacer 310 is not in direct contact with the stack.

Yet another embodiment of the present invention is illustrated in FIG. 6, where the memory cell stacks of two adjacent STT-MRAM cells are depicted, and a piezoelectric material is formed adjacent and between magnetic cell stacks. To explain the process of programming a selected cell, both a selected cell stack 400 and an adjacent unselected cell stack 450 are depicted. In this embodiment, instead of a piezoelectric spacer, an insulative piezoelectric material 410 may be used as the isolation material between the two adjacent cells 400 and 450. An insulative piezoelectric material 410 may sometimes be advantageous in fabrication of the STT-MRAM fabrication since no spacer need be formed. As previously discussed, when a cell is selected to be programmed, voltage may be applied to the selected cell 400. The voltage then drops across the selected cell 400 and an adjacent unselected cell 450 to create a parasitic electric field from the voltage applied to the selected cell 400. This enables the activation of the insulative piezoelectric material 410 and induces a transient stress on the free layer 402 of the selected cell 400 to facilitate its switching. The transient stress generated by the insulative piezoelectric material 410 reduces the critical switching current density, lowering the energy barrier for switching the free layer 402 and programming the memory cell. When no voltage is applied, no stress is applied by the insulative piezoelectric material 410, and the memory cell retains its thermal stability. Additionally, an antiferromagnetic layer 408 may be added to each of the cell stacks 400 and 450 to help pin the pinned layer 406 and maintain magnetization of the pinned layer 406 and enforce stability in the cell. In some embodiments, the insulative piezoelectric material 410 may be isolated from the two adjacent cells 400 and 450 by an insulative spacer 412 such that the insulative piezoelectric material 410 is not in direct contact with the stacks. Further, a dielectric material 414 may be coupled with the insulative piezoelectric material 410 in between the two adjacent cells 400 and 450 such that only the free layer 402 is affected by the effects of the piezoelectric material 410, and the rest of the cell is insulated.

Figure 7:
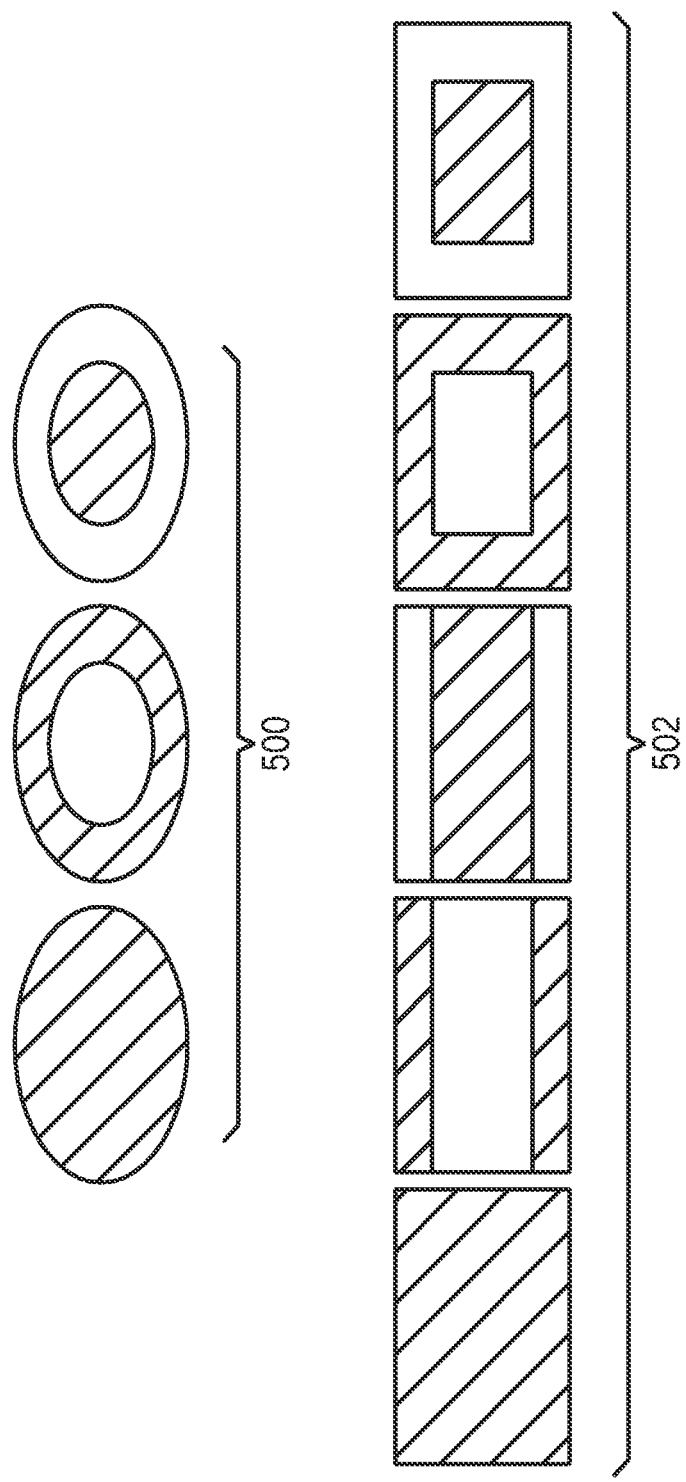
FIG. 7 depicts possible implementations of piezoelectric material in a STT-MRAM cell in accordance with embodiments of the present invention.

In all the described embodiments, and in alternative embodiments, the piezoelectric component incorporated in the STT-MRAM cell may be continuous, with piezoelectric material throughout the layer, spacer or isolation material, or the piezoelectric component may include some combination of piezoelectric and nonmagnetic materials. Nonmagnetic material may be included to provide enhanced conductivity or to provide improved electronic tunneling. Examples of different implementations of a piezoelectric component in a STT-MRAM cell are depicted in FIG. 7. For example, a piezoelectric material may be circular or elliptical, and may comprise substantially piezoelectric material, a ring of piezoelectric material around a core of nonmagnetic material, or a ring of nonmagnetic material around a core of piezoelectric material, or any other combination of piezoelectric and nonmagnetic materials. Examples of the described combinations are depicted in the circular or elliptical cross sections 500, where the shaded portions represent piezoelectric material and the unshaded portions represent nonmagnetic material. Further, a piezoelectric material may be constructed in various other shapes, including square or rectangular layers, and may comprise substantially piezoelectric material, alternating bands of piezoelectric and nonmagnetic materials, piezoelectric material surrounded by nonmagnetic material, nonmagnetic material surrounded by piezoelectric material, or any other combination of piezoelectric and nonmagnetic materials. Examples of the described combinations are depicted in the square or rectangular cross sections 502, where the shaded portions represent piezoelectric material and the unshaded portions represent nonmagnetic material.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for reducing a critical switching current density of a memory cell during operation comprising:
generating a transient stress in a free ferromagnetic layer of the memory cell by generating a parasitic electric field to activate a piezoelectric material of the memory cell, wherein generating the transient stress decreases an energy barrier of the free ferromagnetic layer.

2. The method of claim 1, wherein generating the transient stress reduces a magnetic anisotropy field of the memory cell.

3. The method of claim 2, wherein generating the transient stress introduces an equivalent magnetic field component to the magnetic anisotropy field.

4. The method of claim 1, wherein generating the transient stress changes the alignment of spin-up and spin-down subbands in materials of the free ferromagnetic layer to adjust magnetization of the free ferromagnetic layer.

5. The method of claim 1, wherein generating the transient stress comprises applying a voltage to the piezoelectric material.

6. The method of claim 1, wherein generating the transient stress comprises applying a voltage across a memory cell stack including the piezoelectric material of the memory cell.

7. A method for reducing a critical switching current density of a memory cell during operation comprising:

generating a transient stress in a free ferromagnetic layer of the memory cell by applying a voltage to a piezoelectric material of the memory cell, wherein generating the transient stress decreases an energy barrier of the free ferromagnetic layer.

8. A method for reducing a critical switching current density of a memory cell during operation comprising:
generating a transient stress in a free ferromagnetic layer of the memory cell by applying a voltage to a piezoelectric material of the memory cell, wherein applying the voltage to the piezoelectric material comprises applying the voltage to (TaSe4)2I, multi-layered Alx-Ga1-xAs/GaAs, BaTiO3/VGCF/CPE composites, other piezoelectric and conductive material composites, or any combinations thereof.

9. A method for reducing a critical switching current density of a memory cell during operation comprising:
generating a transient stress in a free ferromagnetic layer of the memory cell by applying a voltage to a piezoelectric material of the memory cell, wherein applying the voltage to the piezoelectric material comprises applying the voltage to berlinite ($AlPO_4$), quartz, gallium orthophosphate ($GaPO_4$), langasite ($La_3Ga_5SiO_{14}$), ceramics with perovskite, tungsten-bronze structures, barium titanate ($BaTiO_3$), SrTiO3, bismuth ferrite ($BiFeO_3$), lead zirconate titanate (Pb[$Zr_xTi_{1-x}$]$O_3$ 0<x<1), $Pb_2KNb_5O_{15}$, lead titanate (Pb-$TiO_3$), lithium tantalate ($LiTaO_3$), sodium tungstate ($Na_xWO_3$), potassium niobate ($KNbO_3$), lithium niobate ($LiNbO_3$), or $Ba_2NaNb_5O_5$, ZnO, AlN, polyvinylidene fluoride (PVDF), lanthanum gallium silicate, potassium sodium tartrate, sodium potassium niobate (KNN), other piezoelectric and insulative material composites, or any combinations thereof.

10. The method of claim 7, wherein applying the voltage comprises applying a programming voltage.

11. The method of claim 10, wherein applying the programming voltage comprises applying the programming voltage across a memory cell stack including the piezoelectric material of the memory cell.

12. The method of claim 11, wherein applying the programming voltage comprises applying the programming voltage to a bit line and a word line of a memory array coupled to the memory cell stack.

13. The method of claim 12, wherein applying the programming voltage comprises applying the programming voltage to the memory cell stack from the word line through an access transistor coupled to the memory cell stack.

14. A method for reducing a critical switching current density of a memory cell during operation comprising:
generating a voltage across a memory cell stack;
generating a transient stress from a piezoelectric material of the memory cell stack to a free layer of the memory cell stack; and
lowering the energy barrier of the free layer for magnetization reversal.

15. The method of claim 14, wherein generating the transient stress comprises generating the transient stress from a piezoelectric layer of the memory cell stack disposed directly on and parallel to the free layer of the memory cell stack.

16. The method of claim 14, wherein generating the transient stress comprises generating the transient stress from the piezoelectric material of the memory cell stack formed directly adjacent and perpendicular to the free layer of the memory cell stack.

17. The method of claim 14, wherein generating the transient stress comprises generating the transient stress from a circular piezoelectric layer of the memory cell stack.

18. The method of claim 14, wherein generating the voltage across the memory cell stack comprises applying a programming voltage to a bit line and a source line of the memory cell.

19. The method of claim 14, wherein generating the transient stress comprises generating a parasitic electric field from the voltage.

* * * * *